United States Patent [19]

Muto

[11] Patent Number: 5,731,730

[45] Date of Patent: Mar. 24, 1998

[54] ZERO LEVEL SETTING CIRCUIT FOR A/D CONVERTER IN A MAGNETIC DISK DRIVE

[75] Inventor: Hiroshi Muto, Kawasaki, Japan

[73] Assignee: Fujitsu Limited, Kawasaki, Japan

[21] Appl. No.: 745,631

[22] Filed: Nov. 8, 1996

Related U.S. Application Data

[62] Division of Ser. No. 267,208, Jul. 6, 1994, Pat. No. 5,602,503.

[30] Foreign Application Priority Data

Sep. 24, 1993 [JP] Japan ................... 5-238203

[51] Int. Cl.$^6$ ................................ H03K 5/08
[52] U.S. Cl. .................. 327/323; 327/538; 360/65
[58] Field of Search .......................... 327/323, 317, 327/332, 312, 551, 538; 360/32, 46, 65; 341/118, 155

[56] References Cited

U.S. PATENT DOCUMENTS 4,334,185  6/1982  Turney et al. .
4,625,240  11/1986  Yablonski et al. .
5,166,559  11/1992  Ishihara .
5,418,660  5/1995  Sato et al. .
5,477,183  12/1995  Hayes ........................ 327/332
5,602,503  2/1997  Muto ........................... 327/323

*Primary Examiner*—Timothy P. Callahan
*Assistant Examiner*—Jung Ho Kim
*Attorney, Agent, or Firm*—Armstron, Westerman, Hattori, McLeland & Naughton

[57] ABSTRACT

In a magnetic disk drive in which an analog signal having symmetrical positive and negative odd levels with respect to a zero-level is read out of a magnetic disk by a head, the read analog signal is processed by an AGC circuit and a low pass filter, the processed analog signal is converted into a digital signal by an A/D converter, and the digital signal is demodulated by a demodulator, a zero-level setting circuit for the A/D converter is comprised of: a reference voltage generator for the A/D converter; a zero-level error detector between the read signal and the reference voltage; an accumulator for accumulating the zero-level error from the zero-level error detector; and an equalizer for equalizing the zero-level of the A/D converter to the reference voltage in accordance to an output signal from the zero-level error accumulator. As a result, the conversion accuracy of the A/D converter is improved while employing a small number of bits.

4 Claims, 10 Drawing Sheets

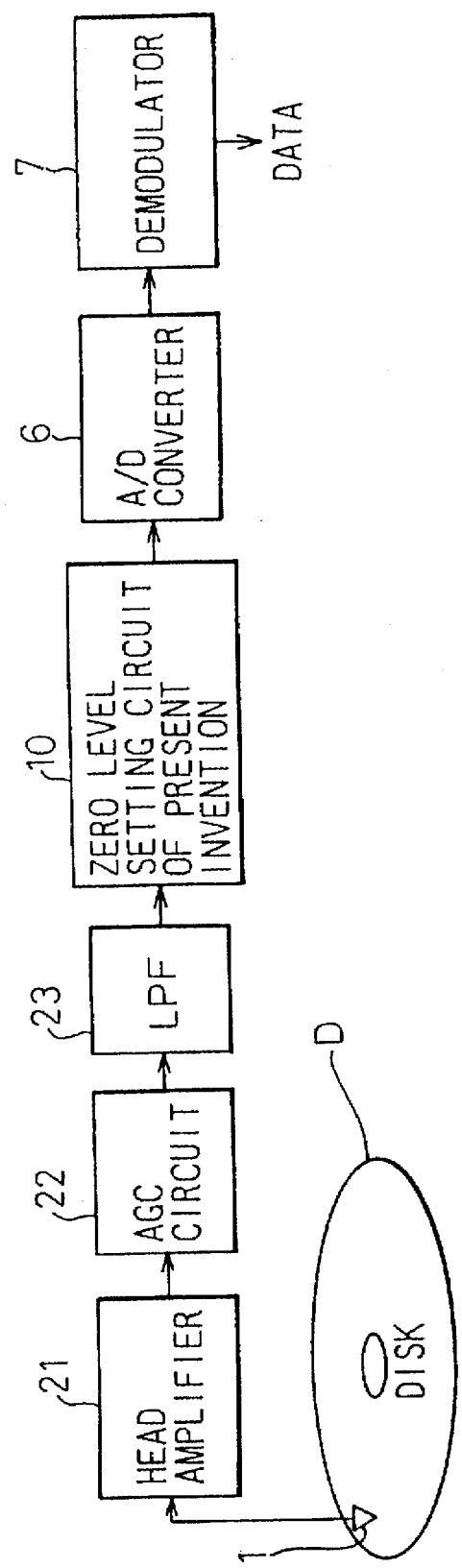

ZERO LEVEL SETTING CIRCUIT FOR A/D CONVERTER IN A MAGNETIC DISK DRIVE

This is a divisional of application Ser. No. 08/267,208 filed Jul. 6, 1994, U.s. Pat. No. 5,602,503.

BACKGROUND OF THE INVENTION

1. Field of the Invention

The present invention relates to a zero level setting circuit for an A/D converter in a magnetic disk drive, and more particularly, the present invention relates to a zero level setting circuit in a signal processing system of a magnetic disk drive for improving the dynamic range of an A/D converter in the signal processing system to process the read signal in a digital state.

2. Description of the Related Art

In recent years, with the increase in speed of computer systems, external storage units such as magnetic disk drives are required to have more speed and capacity. A magnetic disk drive must be equipped with a demodulator capable of handling signals of high frequency and must have high recording density. These requirements are factors which deteriorate the quality of signals. It is necessary, therefore, to improve not only a system relating to a head and a medium of the magnetic disk drive but also the demodulator of the read signal from the disk so that it can demodulate low-quality signals. For this purpose, a digital demodulating system has been proposed.

The digital demodulating system employs an A/D converter for converting an input read signal into a digital signal. To improve conversion accuracy, the A/D converter must employ many bits.

The number of bits of the A/D converter, however, must be as small as possible in terms of circuit scale, power consumption, and heat generation. Accordingly, it is required to provide an A/D converter that can achieve maximum conversion accuracy with a small number of bits.

SUMMARY OF THE INVENTION

The object of the present invention is to provide a zero level setting circuit that can maximize the conversion accuracy of the A/D converter even if the A/D converter employs a small number of bits, by equalizing the zero level of a read signal to that of an A/D converter.

According to the present invention, there is provided a zero level setting circuit for the A/D converter which converts an analog signal into a digital signal in a magnetic disk drive having a head for reading data out of a magnetic disk, signal read means for processing the data and providing a read analog signal having symmetrical positive and negative odd levels with respect to a zero level, and demodulating means for demodulating the digital signal, comprising: means for generating a reference voltage for the A/D converter; means for detecting a zero-level error in the read signal according to the reference voltage; means for accumulating the zero-level error; and means for equalizing the zero level of the A/D converter to the reference voltage according to an output of the zero-level error accumulating means. The read analog signal is preferably a three-value analog signal, the three available values representing "1", "0" and "-1", respectively.

According to the present invention, the zero-level-error detector detects an error in the zero level of an input signal to the A/D converter and provides an error signal. According to the error signal, the error accumulator, which is made of a loop filter and a charge pump, and the zero-level corrector produce an offset to be applied to the input signal. As a result, the zero level of the input signal to the A/D converter always agrees with that of the A/D converter, so that the dynamic range of the A/D converter works effectively.

In this way, the zero level setting circuit according to the present invention equalizes the zero level of a reproduced analog signal in a reproduction system of a magnetic disk drive to the zero level of an A/D converter, so that the A/D converter achieves maximum conversion accuracy with a small number of bits.

BRIEF DESCRIPTION OF THE DRAWINGS

The present invention will be more clearly understood from the description as set forth below with reference to the accompanying drawings, wherein:

FIG. 2A is a block circuit diagram showing the location of the zero level setting circuit in a magnetic disk drive according to the present invention;

DESCRIPTION OF THE PREFERRED EMBODIMENTS

Before describing the preferred embodiments, an explanation will be given of a conventional magnetic disk drive with reference to FIGS. 1A to 1D.

Figure 1A:
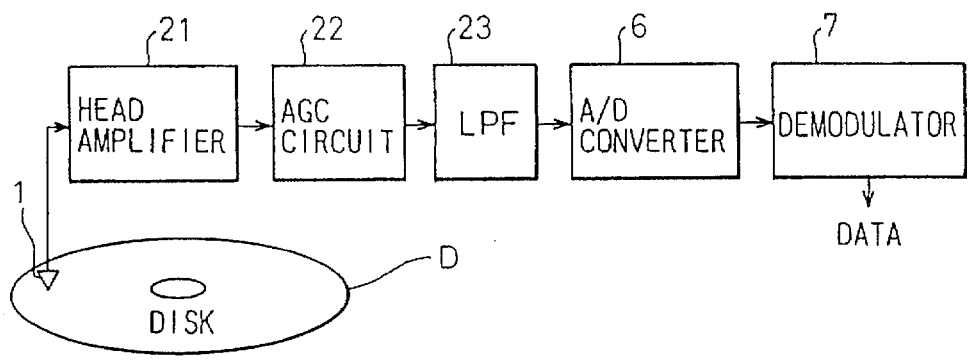
FIG. 1A is a prior art block diagram showing a magnetic disk drive.

FIG. 1A is a block circuit diagram showing the construction of a conventional magnetic disk drive. A head 1 reads data from a magnetic disk D. The read signal is processed by a head amplifier 21, an AGC (automatic gain control) circuit 22, and an LPF (low-pass filter) 23. The read signal output from the LPF 23 is an analog signal, which is converted into a digital signal by an A/D converter 6. The digital signal is demodulated by a demodulator 7.

In this way, the digital demodulating system requires the A/D converter 6 for converting a read analog signal into a digital signal. To improve the conversion accuracy of the A/D converter 6, it must employ a large number of bits.

However, the problem arises in increasing the number of bits handled by the A/D converter 6, the circuit scale and power consumption, and the quantity of heat generated by the A/D converter 6.

Attempts have been made to maximize the conversion accuracy of the A/D converter with a small number of bits. It is, however, very difficult to improve the accuracy because it is hard to adjust fluctuations in an input signal within the dynamic range of the A/D converter.

Figure 1B:
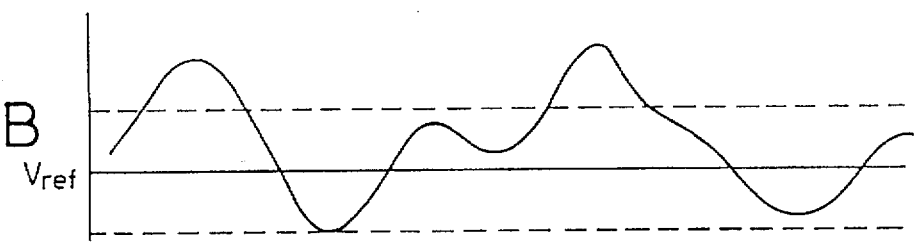
FIG. 1B is a waveform of an input signal to an A/D converter when a zero level of an A/D converter is offset in a positive direction compared with a zero level of a low pass filter.
Figure 1C:
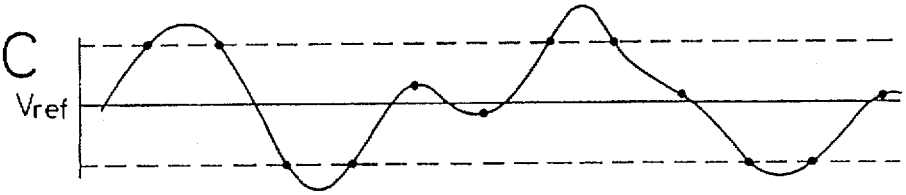
FIG. 1C is a waveform of an input signal to an A/D converter when a zero level of an A/D converter is equal to a zero level of a low pass filter.
Figure 1D:
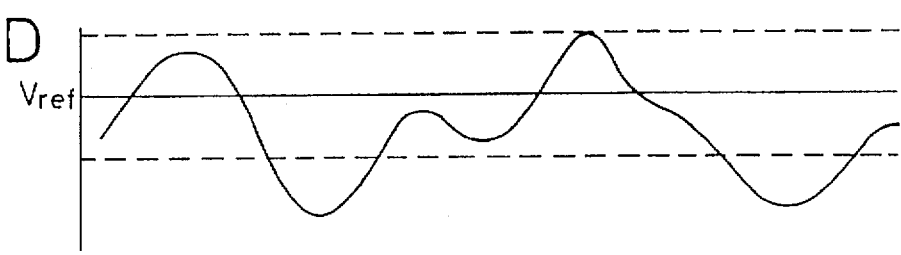
FIG. 1D is a waveform of an input signal to an A/D converter when a zero level of an A/D converter is offset in a negative direction compared with a zero level of a low pass filter.

In the magnetic disk drive, the AGC circuit 22 limits the maximum amplitude of the read signal. If the zero-level of the read signal from the LPF 23 is not equal to the zero level of the A/D converter as shown in FIG. 1B and 1D, it will deteriorate the conversion accuracy. When the zero-level of the read signal from the LPF 23 agrees with the zero level of the A/D converter as shown in FIG. 1C, the conversion accuracy is improved. Contrary to this, when the zero-level of the read signal from the LPF 23 does not agree with a zero level of the A/D converter as shown in FIGS. 1B and 1C, the dynamic range is deteriorated on the positive amplitude side (as shown in FIG. 1B) or negative amplitude side (as shown in FIG. 1D).

Figure 2B:
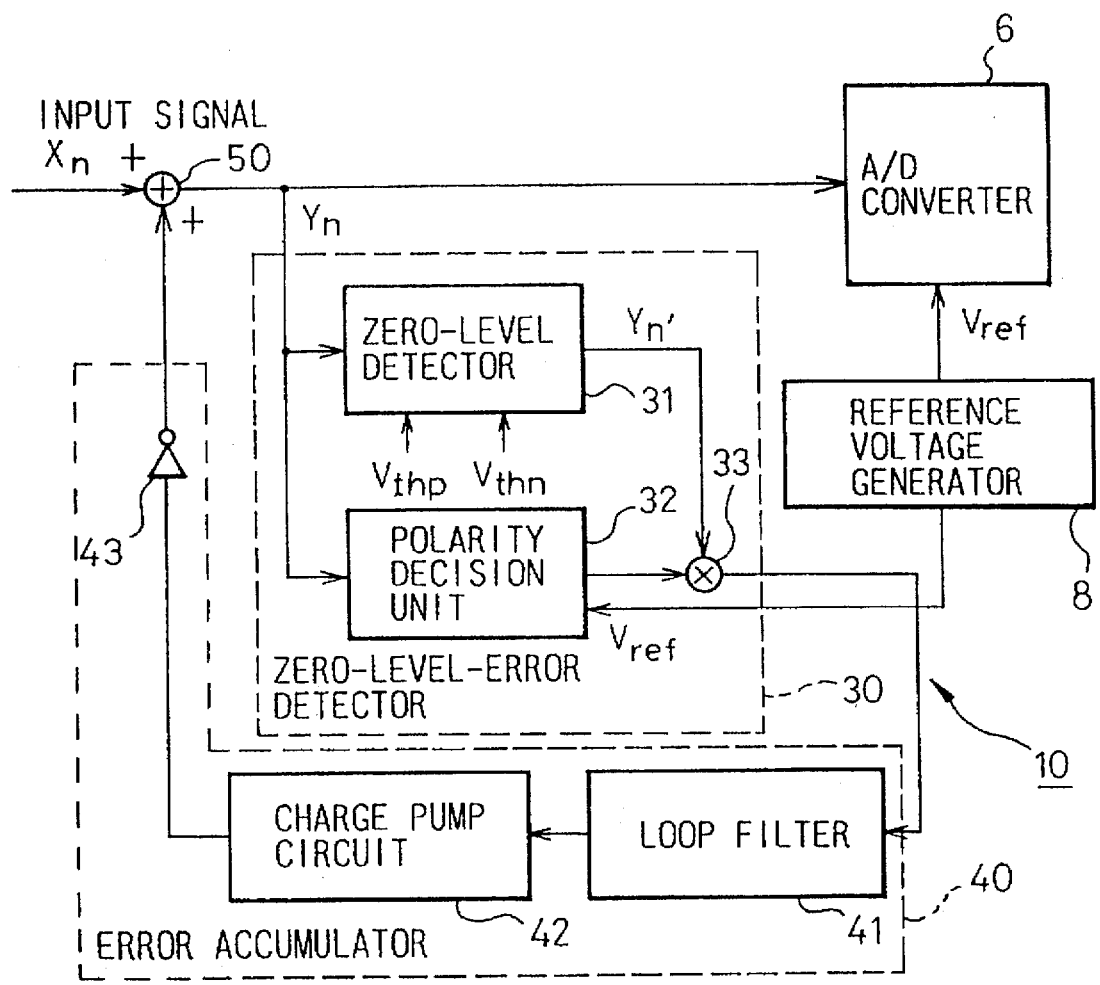
FIG. 2B is a block diagram showing a zero level setting circuit according to a first embodiment of the present invention.

FIG. 2A is a block diagram showing a location of the zero-level setting circuit 10 according to the present invention, and FIG. 2B is a block circuit diagram of a first embodiment of the zero-level setting circuit 10 in FIG. 2A according to the present invention.

In FIG. 2A, the magnetic disk drive demodulates data recorded in a magnetic disk D. The magnetic disk drive has a head 1, a head amplifier 21, an AGC (automatic gain control) circuit 22, an LPF (low-pass filter) 23, an A/D converter 6, and a demodulator 7. The zero-level setting circuit 10 of the present invention is provided between the LPF 23 and the A/D converter 6.

In FIG. 2B, the zero-level setting circuit 10 has a reference voltage generator 8, a zero-level-error detector 30, an error accumulator 40, and an adder 50 as a zero-level corrector. The reference voltage generator 8 generates a reference voltage Vref. The zero-level-error detector 30 detects an error in the zero-level of a read signal (hereinafter referred to as the input signal) Xn from the disk according to the reference voltage Vref. The error accumulator 40 accumulates the zero-level error. The adder 50 equalizes the zero-level of the A/D converter 6 to the reference voltage Vref according to an output of the error accumulator 40. The zero-level-error detector 30 includes a zero-level detector 31, a polarity decision unit 32, and a multiplier 33. The zero-level detector 31 detects a zero-level if the input signal Xn is within a predetermined range between positive and negative values. The polarity decision unit 32 detects the polarity of and an error in the input signal Xn according to the reference voltage Vref. The multiplier 33 multiplies an output of the zero-level detector 31 by an output of the polarity decision unit 32, to calculate a zero-level error. The error accumulator 40 has a loop filter 41, a charge pump circuit 42, and an inverter 43. The adder 50 adds an output of the zero-level-error detector 30 to the input signal Xn.

The zero-level-error detector 30 receives an output of the adder 50 and feeds an output to the error accumulator 40. In the zero-level-error detector 30, the zero-level detector 31 and polarity decision unit 32 are connected in parallel with each other, to feed their outputs to the multiplier 33. The reference voltage generator 8 generates the reference voltage Vref, which is fed to the A/D converter 6 and polarity decision unit 32. The zero-level detector 31 receives two decision voltages Vthp and Vthn (Vthp>Vthn) to determine the zero-level of a signal Yn.

In the zero-level setting circuit 10, the adder 50 adds an offset to the input signal Xn, to thereby form the signal Yn, which is fed to the A/D converter 6 and zero-level-error detector 30. In the zero-level-error detector 30, the signal Yn is fed to the zero-level detector 31 and polarity decision unit 32.

The zero-level detector 31 carries out a three-value test on the signal Yn with use of the decision voltages Vthp and Vthn. Namely, the detector 31 determines if the signal Yn is one of the following three cases:

(1) The signal Yn is less than the decision voltage Vthn;

(2) The signal Yn is greater than or equal to the decision voltage Vthn and less than or equal to the decision voltage Vthp; or (3) The signal Yn is greater than the decision voltage Vthp.

When the signal Yn is greater than or equal to the decision voltage Vthn and less than or equal to the decision voltage Vthp, the zero-level detector 31 determines that the signal Yn is at a zero-level. And only when the signal Yn is at the zero-level, does the zero-level detector 31 feed an output signal Yn' of "1". In the other cases, the zero-level detector 31 feeds an output signal Yn' of "0".

The polarity decision unit 32 compares the signal Yn with the reference voltage Vref, which is equal to the zero-level of the A/D converter 6. The polarity decision unit 32 calculates a zero-level error $\Delta$Vref =f(Yn−Vref) to show the polarity of the signal Yn. The zero-level error $\Delta$ Vref is calculated to be "+1" if Yn −Vref>0, and "−1" in other cases. This zero-level error is fed to the multiplier 33.

The multiplier 33 multiplies the output Yn' of the zero-level detector 31 by the zero-level error $\Delta$Vref from the polarity decision unit 32. Only when the signal Yn is at the zero-level (=the output signal Yn'="1"), does the multiplier 33 feed the zero-level error $\Delta$Vref.

The zero-level error $\Delta$Vref is fed to the loop filter 41 of the error accumulator 40, which applies a proper time constant to the zero-level error and drives the charge pump circuit 42 that produces an offset voltage. The polarity of the offset voltage is inverted by the inverter 43 and is applied to the adder 50, thereby minimizing a difference between the zero-level of an input signal to the A/D converter 6 and the zero-level Vref.

Figure 3A:
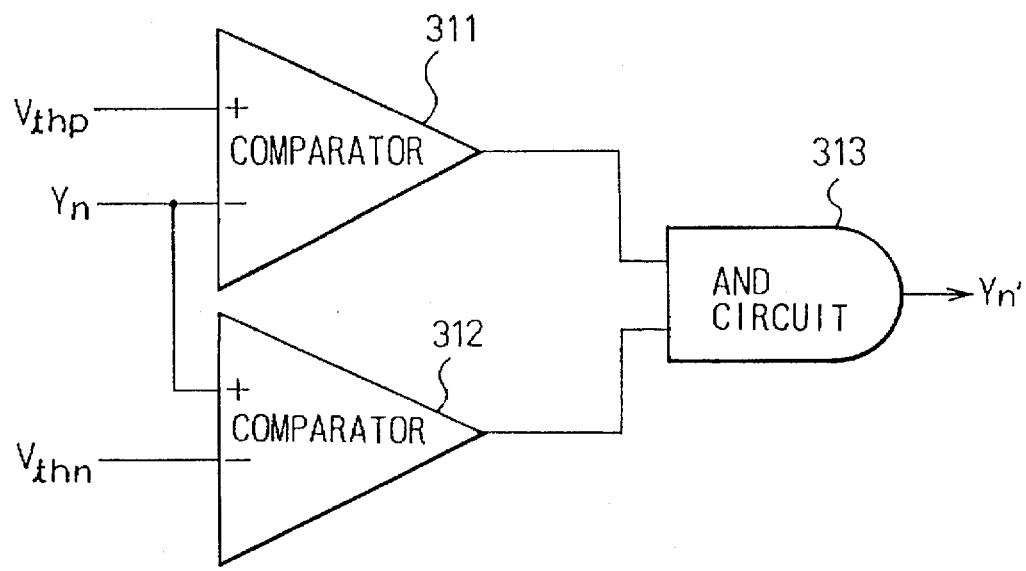
FIG. 3A is a circuit diagram showing a zero-level detector in the circuit of FIG. 2B.
Figure 3B:
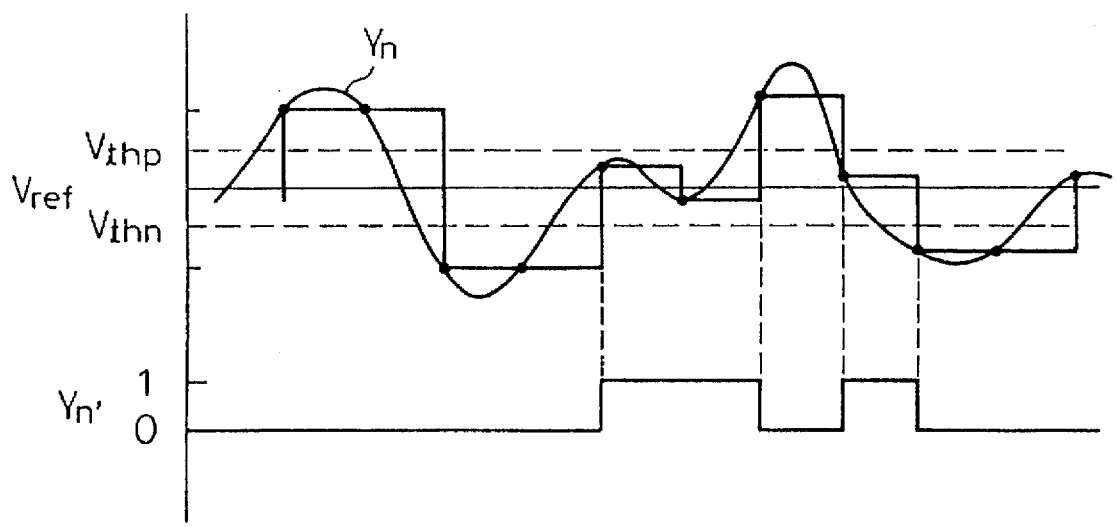
FIG. 3B are waveforms showing an input signal to a zero-level detector and an output signal therefrom.

FIG. 3A shows the zero-level detector 31 of FIG. 2B, and FIG. 3B shows the operation of the zero-level detector 31.

The zero-level detector 31 has a first comparator 311, a second comparator 312, and an AND circuit 313. A positive input terminal of the first comparator 311 receives the decision voltage Vthp, and a negative input terminal of the second comparator 312 receives the decision voltage Vthn. A negative input terminal of the first comparator 311 and a positive input terminal of the second comparator 312 each receive the signal Yn. Outputs of the first and the second comparators 311 and 312 are two input terminals of the AND circuit 313.

The first comparator 311 feeds a high-level output of "1" if the signal Yn is less than the decision voltage Vthp, and the second comparator 312 feeds a high-level output of "1"

when the signal Yn is greater than the decision voltage Vthn. In other cases, the comparators 311 and 312 each feed a low-level output of "0". Accordingly, the AND circuit 313 feeds a high-level output of "1" only when the signal Yn is greater than the decision voltage Vthn and less than the decision voltage Vthp.

FIG. 3B shows the input characteristic of the signal Yn, and the output characteristic of the signal Yn' of the AND circuit 313. Only when the signal Yn is greater than the decision voltage Vthn and smaller than the decision voltage Vthp at each sampling point (indicated with a black dot) of the signal Yn, does the output signal Yn' of the AND circuit 313 become the high level of "1".

In this way, in the zero-level setting circuit 10 of FIG. 2B, the adder 50 adds an offset voltage to the input signal Xn and produces the output signal Yn, which is supplied to the A/D converter 6 and zero-level-error detector 30. The zero-level-error detector 30 detects an error between the zero-level of the signal Yn and the zero-level Vref of the A/D converter 6. The loop filter 41 and charge pump circuit 42 calculate an amount of offset, and the adder 50 adds the offset amount to the input signal Xn. This results in minimizing a difference between the zero-level of the input signal to the A/D converter 6 and the zero-level Vref of the A/D converter 6. As a result, the range of changes in the input signal Xn agrees with the dynamic range of the A/D converter 6, so that the A/D converter 6 achieves maximum conversion accuracy with a small number of bits.

Figure 4:
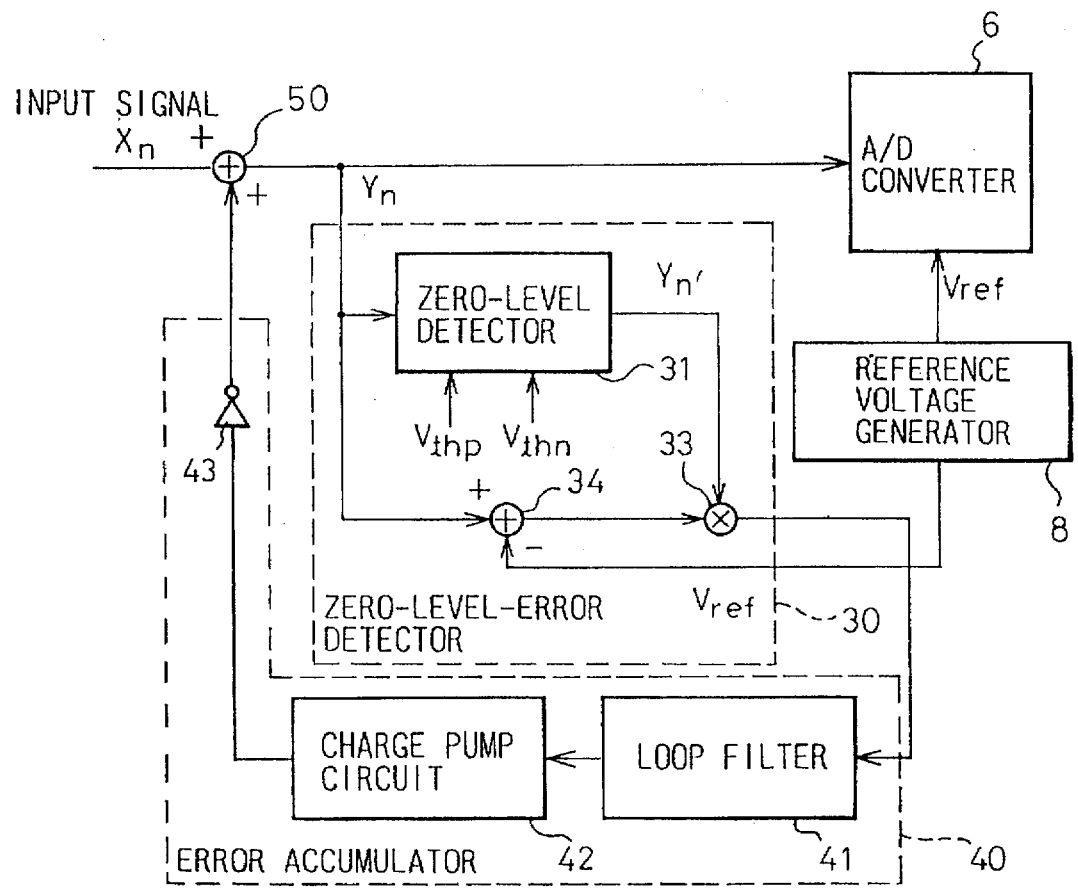
FIG. 4 is a block circuit diagram showing a zero level setting circuit according to a second embodiment of the present invention.

FIG. 4 is a block diagram showing a zero-level setting circuit 10 according to a second embodiment of the present invention. The zero-level setting circuit of the second embodiment differs from that of the first embodiment in that it employs a subtracter 34 instead of the polarity decision unit 32 of FIG. 2B. The same parts as those of FIG. 2B are represented with the same reference marks, and their explanations are not repeated.

According to the second embodiment, the subtracter 34 subtracts the reference voltage Vref from the signal Yn and provides a zero-level error $\Delta Vref=(Yn-Vref)$. This zero-level error $\Delta Vref$ is given to a loop filter 41 of an error accumulator 40, which applies a proper time constant to the zero-level error $\Delta Vref$ and drives a charge pump circuit 42. The charge pump circuit 42 produces an offset voltage. The polarity of the offset voltage is inverted by an inverter 43 and is applied to an adder 50. This results in minimizing a difference between the zero-level of an input signal to an A/D converter 6 and the zero-level Vref of the A/D converter 6.

Figure 5:
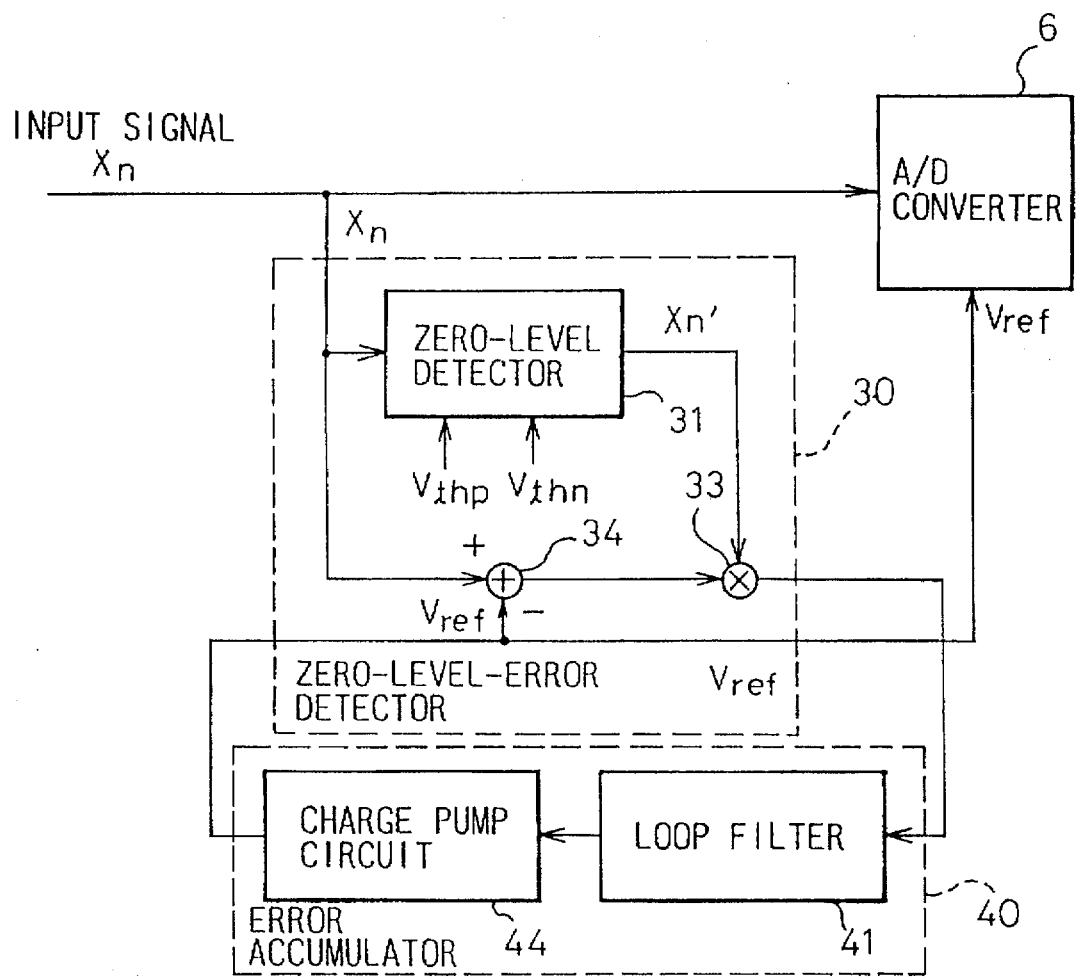
FIG. 5 is a block diagram showing a zero level setting circuit according to a third embodiment of the present invention.

FIG. 5 is a block diagram showing a zero-level setting circuit according to a third embodiment of the present invention. The first and second embodiments add an offset voltage to the input signal Xn, to equalize the zero-level of the input signal Xn to the zero-level of the A/D converter 6. The third embodiment directly controls the zero-level Vref of the A/D converter 6, to provide the same effect.

The third embodiment employs only a zero-level-error detector 30 and an error accumulator 40. The arrangements of the zero-level-error detector 30 of the third embodiment are the same as those of the second embodiment. They may be the same as those of the first embodiment.

According to the third embodiment, the error accumulator 40 produces the reference voltage Vref. A subtracter 34 subtracts the reference voltage Vref from the input signal Xn and provides a zero-level error $\Delta Vref=(Xn-Vref)$. A loop filter 41 of the error accumulator 40 applies a proper time constant to the zero-level error Vref and drives a charge pump circuit 42, which produces the reference voltage Vref.

The reference voltage Vref is supplied to the subtracter 34, which calculates the zero-level error $\Delta Vref=(Xn-Vref)$. At the same time, the reference voltage Vref is supplied as it is to the A/D converter 6, thereby equalizing the zero-level of an input signal to the A/D converter 6 to the zero-level of the A/D converter 6.

In this way, this embodiment equalizes the zero-level of the range of changes in the input signal Xn to the zero-level of the A/D converter 6, so that the A/D converter effectively uses the dynamic range of the input signal Xn and achieves maximum converse,on accuracy with a small number of bits.

Figure 6:
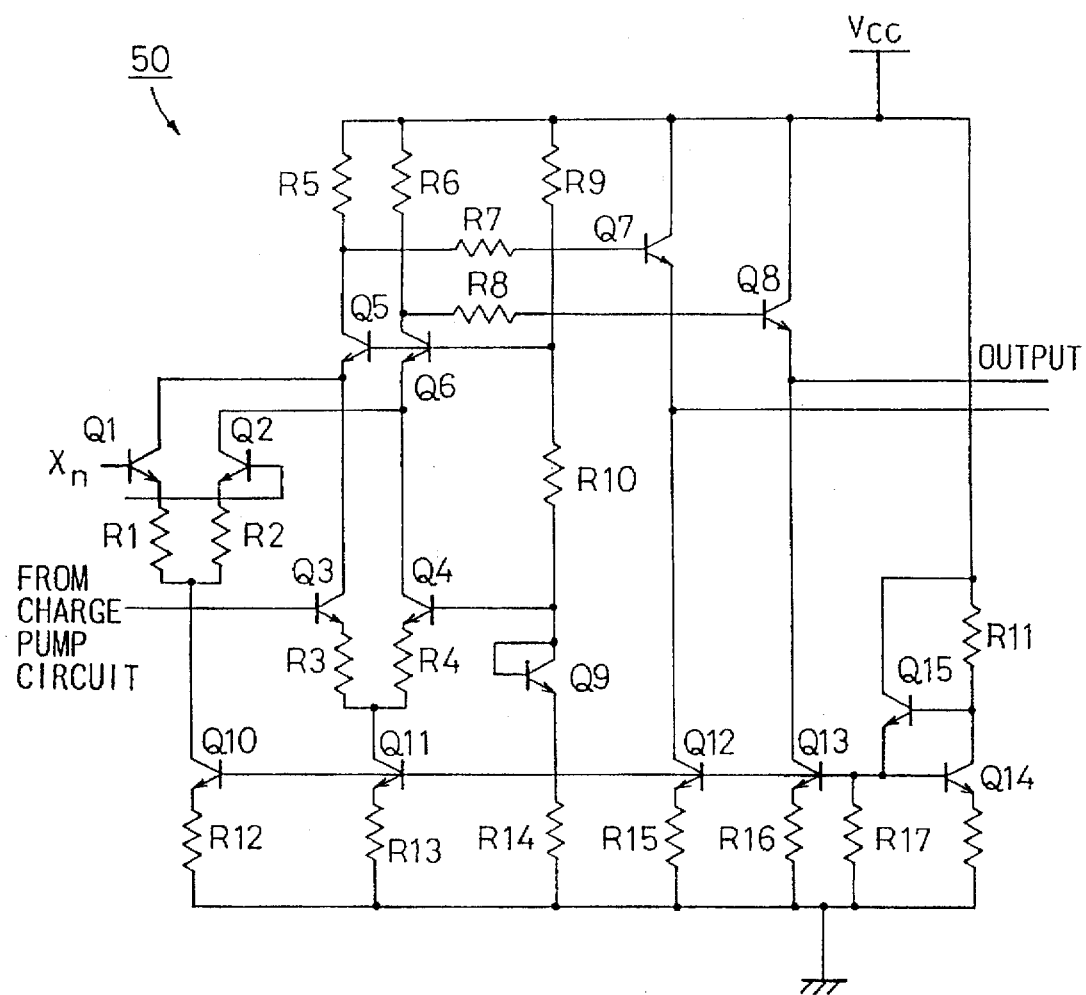
FIG. 6 is a circuit diagram showing one example of an adder according to the present invention.

FIG. 6 is a circuit diagram showing the adder 50 of anyone of FIGS. 2A and 4.

The adder 50 for adding an offset to the input signal Xn has transistors Q1 to Q15 and resistors R1 to R18. The input signal Xn is received by the transistors Q1 and Q2 that form a differential amplifier. An offset voltage from the charge pump is received by the transistors Q3 and Q4 that form a differential amplifier. Another input of the differential amplifier of the transistors Q3 and Q4 is connected to a bias source made of the resistors R9 and R10, transistor Q9, and resistor R14.

The collector side of the differential amplifiers made of the transistors Q1 and Q2, and the collector side of the differential amplifiers made of the transistors Q3 and Q4 are connected to the common load resistors R5 and R6 through the transistors Q5 and Q6. Input voltages to each of the differential amplifiers are added in the form of currents and appear between both terminals of the common load resistors R5 and R6. The voltage of the collectors is fed outside through an emitter follower made of the transistors Q7 and Q8.

Figure 7:
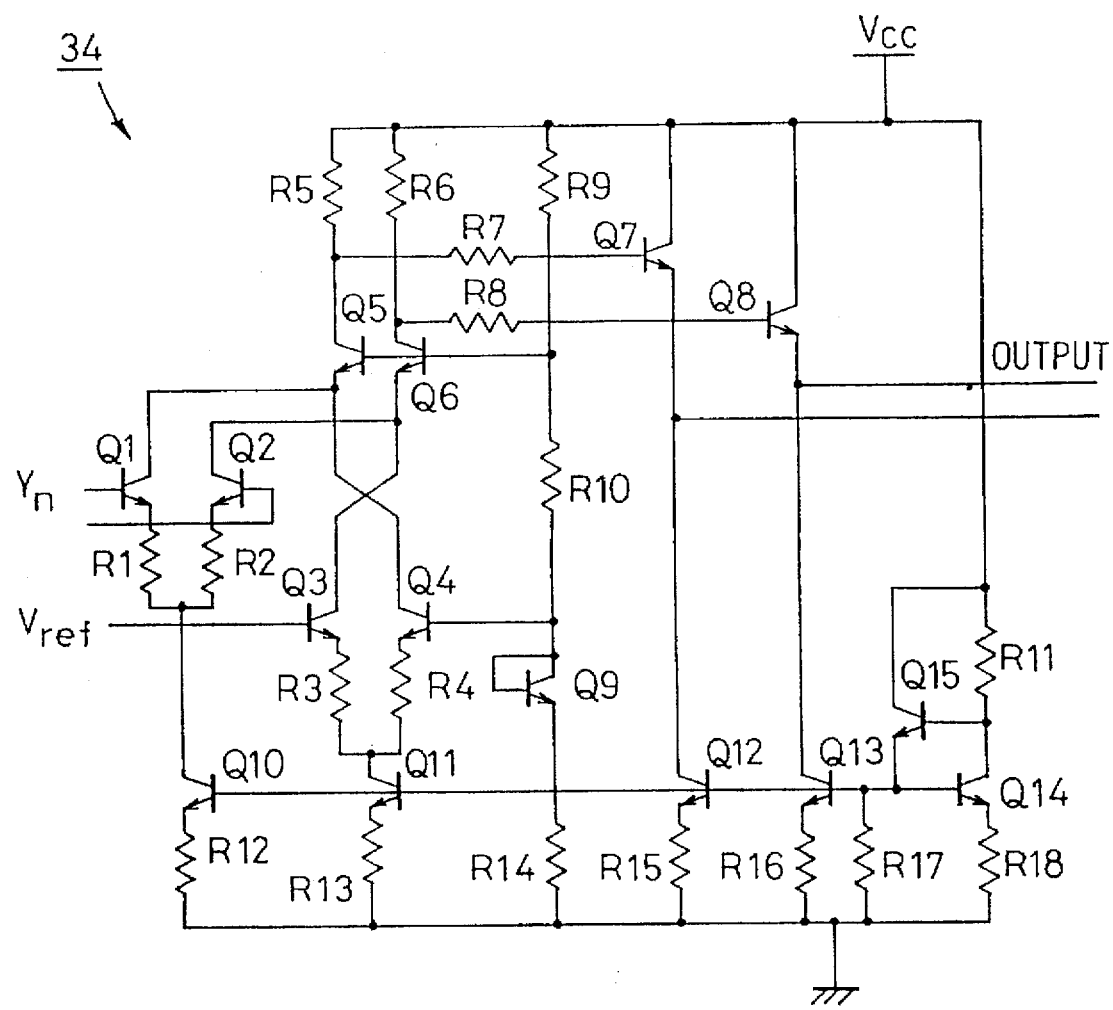
FIG. 7 is a concrete circuit diagram showing one example of a subtracter according to the present invention.

FIG. 7 is a circuit diagram showing the subtracter 34 of any one of FIGS. 4 and 5.

The subtracter 34 resembles the adder 50 and calculates a difference between the input signal Yn and the reference voltage Vref of the A/D converter 6. The subtracter 34 includes transistors Q1 to Q15 and resistors R1 to R18. Unlike the adder 50, a differential amplifier made of the transistors Q1 and Q2 is reversely connected to a differential amplifier made of the transistors Q3 and Q4, to provide a difference between their inputs.

Figure 8:
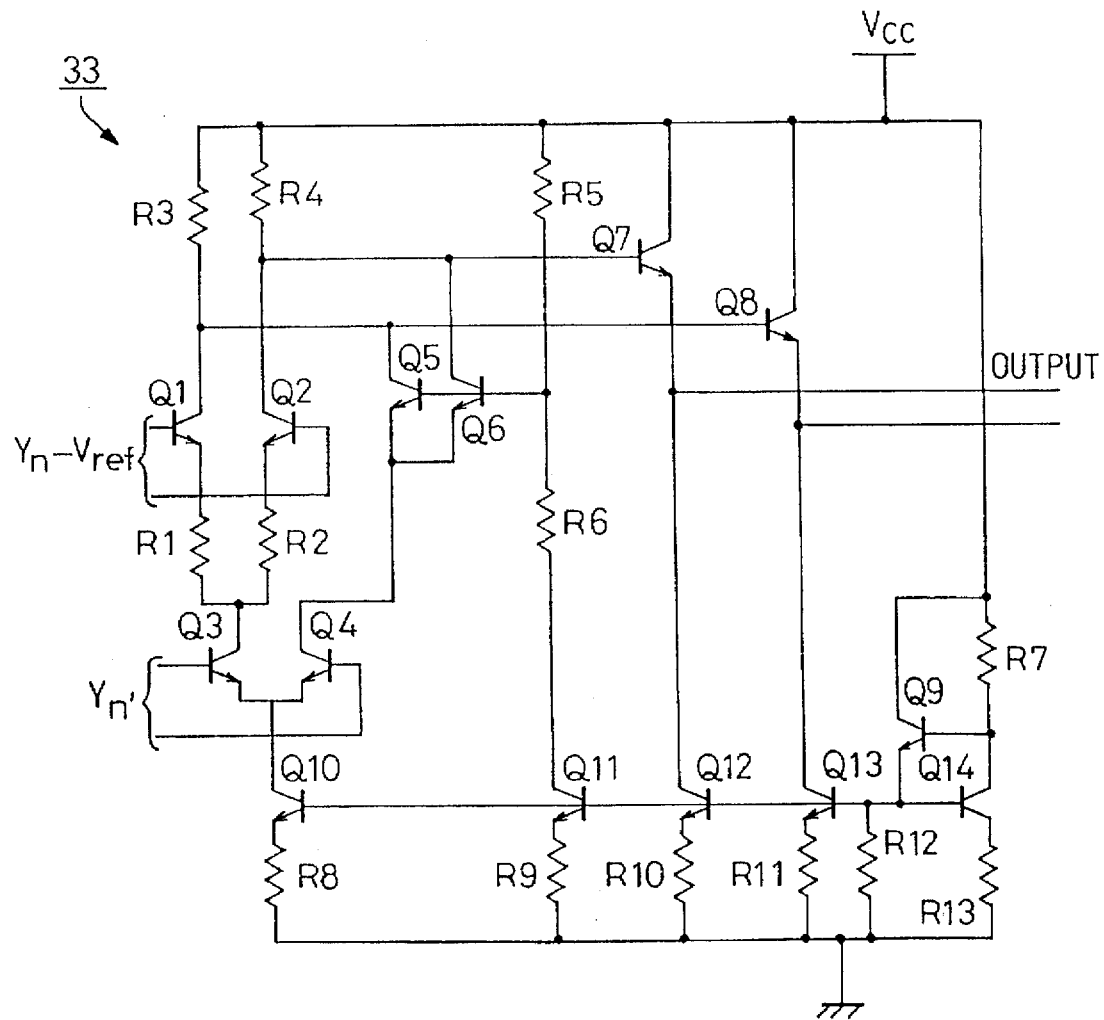
FIG. 8 is a circuit diagram showing one example of a multiplier according to the present invention.

FIG. 8 is a circuit diagram showing the multiplier 33 of any one of FIGS. 2A, 4, and 5. The multiplier includes transistors Q1 to Q14 and resistors R1 to R13.

The multiplier 33 multiplies the signal Yn' of "0" or "1" by the polarity, i.e., the difference Yn–Vref of the input signal Yn. When the signal Yn' is "1", a current from a current source of the transistor Q10 flows through the transistor Q3, to activate a differential amplifier made of the transistors Q1 and Q2.

In this case, the polarity, i.e., the difference Yn–Vref is supplied outside through an emitter follower made of the transistors Q7 and Q8.

When the signal Yn' is "0", the current from the current source of the transistor Q10 flows to the pair of transistors Q5 and Q6 through the transistor Q4 and passes through the load resistors R3 and R4. Since the current is constant, a voltage produced by the load resistors R3 and R4 is irrelevant to the polarity, i.e., the difference Yn–Vref.

Figure 9:
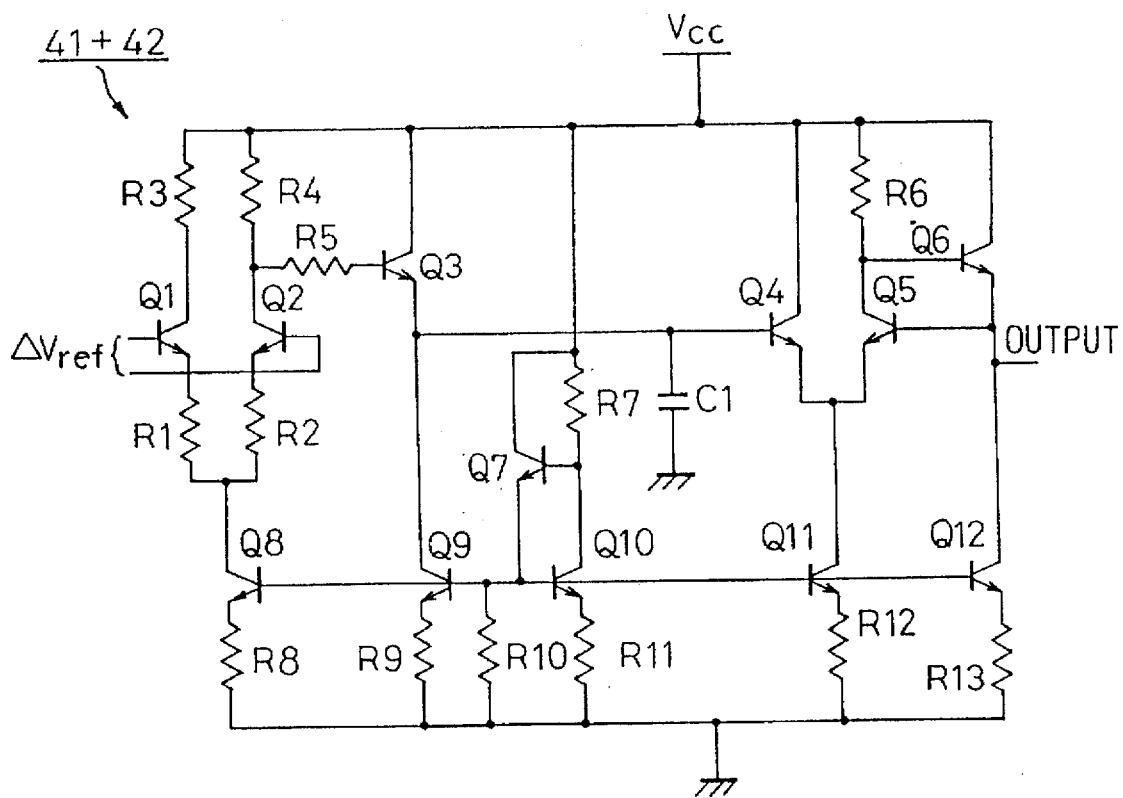
FIG. 9 is a circuit diagram showing one example of a loop filter and a charge pump according to the present invention.

FIG. 9 is a circuit diagram showing the loop filter 41 and charge pump circuit 42 of any one of FIGS. 2A, 4, and 5. They include transistors Q1 to Q12, resistors R1 to R13, and a capacitor C1.

The circuits 41 and 42 accumulate the difference (=the zero-level error $\Delta Vref$) between the input signal Yn applied to the charge pump circuit 42 and the reference voltage Vref of the A/D converter 6 and produce an offset voltage. The difference Vref is received by a buffer circuit made of the transistors Q1, Q2, and Q3 to charge or discharge the capacitor C1 at low impedance. As a result, the capacitor C1 produces a voltage, which is supplied to the next stage through a buffer circuit made of the transistors Q4, Q5, and Q6.

Each of the circuits shown in FIGS. 6 to 9 has two input and output systems, so that an analog signal read from the disk is differentially handled. Every analog circuit after the head amplifier is a differential circuit. In the analog circuit, an absolute voltage has no effect and only a difference between two lines is effective. Since this is a known fact, it will not be explained in detail.

As explained above, the zero-level setting circuit according to the present invention equalizes the zero-level of a read analog signal in a reproduction system of a magnetic disk drive to the zero-level of an A/D converter, so that the A/D converter achieves maximum conversion accuracy with a small number of bits.

What is claimed is:

1. A zero-level setting circuit for an A/D converter in a magnetic disk drive in which an analog signal having symmetrical positive and negative odd levels with respect to a zero-level is read out of a magnetic disk by a head, the read analog signal is processed by a signal read means, the processed analog signal is converted into a digital signal by an A/D converter, and the digital signal is demodulated by a demodulating means, comprising:

means for generating a reference voltage for the A/D converter;

means for detecting a zero-level error between the read signal and the reference voltage;

means for accumulating the zero-level error from the zero-level error detecting means; and means for equalizing the zero-level of the read signal to the reference voltage in accordance with an output signal from the zero-level error accumulating means, wherein the zero-level error detecting means has a zero-level detector for detecting a zero-level when the read signal is within a predetermined range between positive and negative values, a subtractor for subtracting the reference voltage from the read signal, and a multiplier for multiplying an output signal of the zero-level detector by an output signal of the subtractor and providing the zero-level error;

the error accumulating means has a loop filter and a charge pump circuit; and the zero-level equalizing means has an adder for adding an output signal of the error accumulating means to the read signal and providing an offset.

2. A zero-level setting circuit for an A/D converter in a magnetic disk drive in which an analog signal having symmetrical positive and negative odd levels with respect to a zero-level is read out of a magnetic disk by a head, the read analog signal is processed by a signal read means, the processed analog signal is converted into a digital signal by an A/D converter, and the digital signal is demodulated by a demodulating means, comprising:

means for generating a reference voltage for the A/D converter;

means for detecting a zero-level error between the read signal and the reference voltage:

means for accumulating the zero-level error from the zero-level error detecting means; and means for equalizing the zero-level of the read signal to the reference voltage in accordance with an output signal from the zero-level error accumulating means, wherein the error accumulating means has functions of the reference voltage generating means and zero-level equalizing means, to generate the reference voltage according to an output of the zero-level error detecting means and provide the A/D converter and zero-level error detecting means with the reference voltage.

3. The zero-level setting circuit as set forth in claim 2, wherein:

the zero-level error detecting means has a zero-level detector for detecting a zero-level when the read signal is within a predetermined range between positive and negative values, a subtracter for subtracting the reference voltage from the read signal, and a multiplier for multiplying an output signal of the zero-level detector by an output signal of the subtracter and providing the zero-level error; and the error accumulating means has a loop filter and a charge pump circuit.

4. A zero-level setting circuit for an A/D converter in a magnetic disk drive in which an analog signal having symmetrical positive and negative odd levels with respect to a zero-level is read out of a magnetic disk by a head, the read analog signal is processed by a signal read means, the processed analog signal is converted into a digital signal by an A/D converter, and the digital signal is demodulated by a demodulating means, comprising:

means for generating a reference voltage for the A/D converter;

means for detecting a zero-level error between the read signal and the reference voltage;

means for accumulating the zero-level error from the zero-level error detecting means; and means for equalizing the zero-level of the A/D converter to the reference voltage in accordance with an output signal from the zero-level error accumulating means, wherein, the zero-level detector has a first comparator for comparing the read signal with a first threshold that is on the positive side of the reference voltage, a second comparator for comparing the read signal with a second threshold that is on the negative side of the reference voltage, and an AND circuit for providing an AND of output of the first and second comparators as a zero-level decision signal "one" of the read signal when the read signal is less than or equal to the first threshold and greater than or equal to the second threshold; and the read analog signal having symmetrical positive and negative odd levels with respect to a zero-level is a three-value analog signal.

* * * * *